United States Patent
Sato

(10) Patent No.: US 9,231,113 B2
(45) Date of Patent: Jan. 5, 2016

(54) FLASH MEMORY WITH P-TYPE FLOATING GATE

(71) Applicant: SANDISK TECHNOLOGIES INC., Plano, TX (US)

(72) Inventor: Kenji Sato, Kuwana (JP)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 14/531,857

(22) Filed: Nov. 3, 2014

(65) Prior Publication Data
US 2015/0060987 A1    Mar. 5, 2015

Related U.S. Application Data

(62) Division of application No. 13/629,236, filed on Sep. 27, 2012, now Pat. No. 8,906,762.

(51) Int. Cl.
| | |
|---|---|
| *H01L 29/788* | (2006.01) |
| *H01L 21/28* | (2006.01) |
| *H01L 27/115* | (2006.01) |
| *H01L 29/423* | (2006.01) |
| *H01L 29/49* | (2006.01) |

(52) U.S. Cl.
CPC ........ *H01L 29/788* (2013.01); *H01L 21/28114* (2013.01); *H01L 21/28273* (2013.01); *H01L 27/11529* (2013.01); *H01L 27/11536* (2013.01); *H01L 27/11539* (2013.01); *H01L 27/11541* (2013.01); *H01L 29/42324* (2013.01); *H01L 29/42376* (2013.01); *H01L 29/4916* (2013.01)

(58) Field of Classification Search
CPC ............... H01L 29/42324; H01L 21/28282; H01L 29/66825
USPC .................. 257/315, 316, 331, 365, E21.179, 257/E21.18
See application file for complete search history.

(56) References Cited

U.S. PATENT DOCUMENTS

| | | | |
|---|---|---|---|
| 6,078,075 | A | 6/2000 | Widdershoven |
| 6,812,099 | B2 | 11/2004 | Lin |

(Continued)

OTHER PUBLICATIONS

PCT International Search Report dated Feb. 21, 2014, PCT Patent Application No. PCT/US2013/059090.
PCT Written Opinion of the International Searching Authority dated Feb. 21, 2014, PCT Patent Application No. PCT/US2013/059090.
Office Action dated May 15, 2013, U.S. Appl. No. 13/629,236.

(Continued)

*Primary Examiner* — Julia Slutsker
(74) *Attorney, Agent, or Firm* — Vierra Magen Marcus LLP

(57) ABSTRACT

Methods for manufacturing non-volatile memory devices including peripheral transistors with reduced and less variable gate resistance are described. In some embodiments, a NAND-type flash memory may include floating-gate transistors and peripheral transistors (or non-floating-gate transistors). The peripheral transistors may include select gate transistors (e.g., drain-side select gates and/or source-side select gates) and/or logic transistors that reside outside of a memory array region. A floating-gate transistor may include a floating gate of a first conductivity type (e.g., n-type) and a control gate including a lower portion of a second conductivity type different from the first conductivity type (e.g., p-type). A peripheral transistor may include a gate including a first layer of the first conductivity type, a second layer of the second conductivity type, and a cutout region including one or more sidewall diffusion barriers that extends through the second layer and a portion of the first layer.

20 Claims, 11 Drawing Sheets

(56) References Cited

U.S. PATENT DOCUMENTS

| | | |
|---|---|---|
| 7,582,529 B2 | 9/2009 | Matamis |
| 7,592,223 B2 | 9/2009 | Orimoto |
| 7,700,426 B2 | 4/2010 | Kim |
| 7,704,832 B2 | 4/2010 | Kai |
| 7,807,533 B2 | 10/2010 | Lutze |
| 2007/0042547 A1 | 2/2007 | Kikuchi |
| 2008/0081462 A1* | 4/2008 | Choi ............... H01L 21/76807 438/637 |
| 2009/0085091 A1 | 4/2009 | Nagai |
| 2010/0055889 A1 | 3/2010 | Purayath |
| 2011/0241094 A1 | 10/2011 | Morikado |
| 2011/0254077 A1 | 10/2011 | Lee |
| 2011/0260235 A1* | 10/2011 | Orimoto ........... H01L 21/28273 257/319 |
| 2012/0025289 A1 | 2/2012 | Liang |
| 2012/0032246 A1* | 2/2012 | Honda ............. H01L 21/28273 257/316 |

OTHER PUBLICATIONS

Response to Office Action dated Jun. 6, 2013, U.S. Appl. No. 13/629,236.
Office Action dated Jun. 17, 2013, U.S. Appl. No. 13/629,236.
Response to Office Action dated Sep. 16, 2013, U.S. Appl. No. 13/629,236.
Office Action dated Oct. 18, 2013, U.S. Appl. No. 13/629,236.
Response to Office Action dated Jan. 21, 2014, U.S. Appl. No. 13/629,236.
Office Action dated May 23, 2014, U.S. Appl. No. 13/629,236.
Response to Office Action dated Aug. 24, 2014, U.S. Appl. No. 13/629,236.
Office Action dated Sep. 18, 2014, U.S. Appl. No. 13/629,236.
Response to Office Action dated Oct. 1, 2014, U.S. Appl. No. 13/629,236.
Notice of Allowance dated Oct. 16, 2014, U.S. Appl. No. 13/629,236.

* cited by examiner (Prior Art)

Memory Array | Peripheral Circuitry

Memory Array | Peripheral Circuitry

FLASH MEMORY WITH P-TYPE FLOATING GATE

CLAIM OF PRIORITY

The present application is a divisional application of U.S. patent application Ser. No. 13/629,236, entitled "Flash Memory with P-Type Floating Gate," filed on Sep. 27, 2012, which is herein incorporated by reference in its entirety.

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

Both flash memory and EEPROM utilize floating-gate transistors. For each floating-gate transistor, a floating gate is positioned above and insulated from a channel region of the floating-gate transistor. The channel region is positioned between source and drain regions of the floating-gate transistor. A control gate is positioned above and insulated from the floating gate. The threshold voltage of the floating-gate transistor may be controlled by setting the amount of charge stored on the floating gate. The amount of charge on the floating gate is typically controlled using Fowler-Nordheim tunneling or hot-electron injection. The ability to adjust the threshold voltage allows a floating-gate transistor to act as a non-volatile storage element or memory cell. In some cases, more than one data bit per memory cell (i.e., a multi-level or multi-state memory cell) may be provided by programming and reading multiple threshold voltages or threshold voltage ranges.

NAND flash memory structures typically arrange multiple floating-gate transistors in series with and between two select gates. The floating-gate transistors in series and the select gates are referred to as a NAND string. In recent years, NAND flash memory has been scaled (faster than Moore's law) in order to reduce cost per bit. However, as process geometries shrink, many design and process challenges are presented. These challenges include increased gate resistance and/or EI resistance for peripheral transistors including select gate transistors.

DETAILED DESCRIPTION

Technology is described for manufacturing non-volatile memory devices including peripheral transistors with reduced and less variable gate resistance. In some embodiments, a NAND-type flash memory may include floating-gate transistors and peripheral transistors (or non-floating-gate transistors). The peripheral transistors may include select gate transistors (e.g., drain-side select gates and/or source-side select gates) and/or logic transistors that reside outside of a memory array region. A floating-gate transistor may include a floating gate of a first conductivity type (e.g., n-type) and a control gate including a lower portion of a second conductivity type different from the first conductivity type (e.g., p-type). A peripheral transistor may include a gate including a first layer of the first conductivity type, a second layer of the second conductivity type, and a cutout region (e.g., an EI cutout) including one or more sidewall diffusion barriers that extends through the second layer and a portion of the first layer.

In many cases it is desirable to reduce process complexity (e.g., by reducing the number of process steps required to manufacture a semiconductor device) in order to improve semiconductor device yields and to reduce fabrication costs. One issue with fabricating a peripheral transistor using the same process flow as a floating-gate transistor with a floating gate layer of a different conductivity type than a lower portion of a control gate layer is that a parasitic bipolar device (e.g., a PNP device) may be formed due to the diffusion of ions (e.g., boron ions) from the lower portion of the control gate layer into a cutout region shorting the control gate layer to the floating gate layer. The formation of a parasitic bipolar device within the cutout region may increase the effective gate resistance of peripheral transistors. Thus, there is a need for manufacturing non-volatile memory devices including peripheral transistors with reduced and less variable gate resistance.

Figure 1:
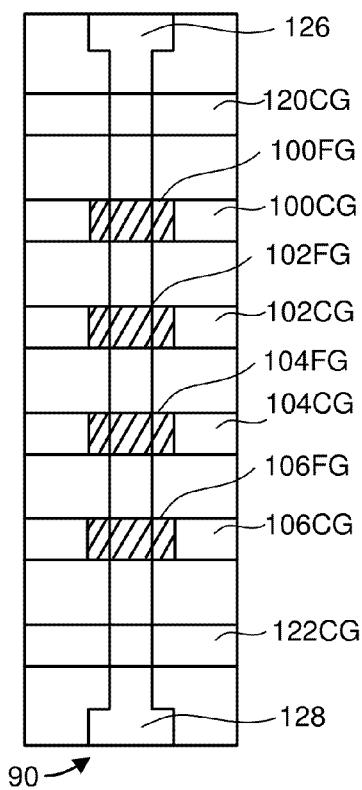
FIG. 1 depicts one embodiment of a NAND string.
Figure 2:
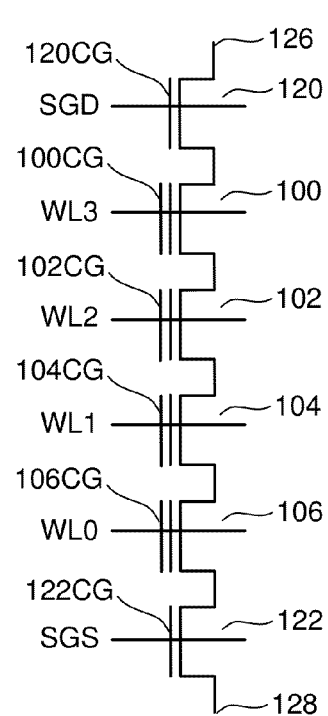
FIG. 2 depicts one embodiment of the NAND string of FIG. 1 using a corresponding circuit diagram.

FIG. 1 depicts one embodiment of a NAND string 90. FIG. 2 depicts one embodiment of the NAND string of FIG. 1 using a corresponding circuit diagram. As depicted, NAND string 90 includes four transistors, 100, 102, 104, and 106, in series between a first select gate 120 (i.e., a drain-side select gate) and a second select gate 122 (i.e., a source-side select gate). Select gate 120 connects the NAND string 90 to a bit line 126. Select gate 122 connects the NAND string 90 to a source line 128. Select gate 120 is controlled by applying the appropriate voltage to control gate 120CG (i.e., via select line SGD of FIG. 2). Select gate 122 is controlled by applying the appropriate voltage to control gate 122CG (i.e., via select line SGS of FIG. 2). Each of the transistors 100, 102, 104, and 106 includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gates 100CG, 102CG, 104CG, and 106CG are connected to word lines WL3, WL2, WL1, and WL0, respectively.

Note that although FIGS. 1 and 2 show four floating-gate transistors in the NAND string, the use of four floating-gate transistors is only provided as an example. A NAND string may have less than or more than four floating-gate transistors (or memory cells). For example, some NAND strings may include 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND flash memory structure includes a plurality of NAND strings within a memory block. A memory block may comprise a unit of erase. In some cases, the NAND strings within a memory block may share a common well (e.g., a P-well). Each NAND string may be connected to a common source line by its source-side select gate (e.g., controlled by select line SGS) and connected to its associated bit line by its drain-side select gate (e.g., controlled by select line SGD). Typically, each bit line runs on top of (or over) its associated NAND string in a direction perpendicular to the word lines and is connected to a sense amplifier.

Although technology using NAND-type flash memory is described herein, the technology disclosed herein may also be applied to other types of non-volatile storage devices and architectures (e.g., NOR-type flash memory). Moreover, although technology using floating-gate transistors is described herein, the technology described herein may also be applied to or used with other memory technologies including those that employ charge trapping, phase-change (e.g., chalcogenide materials), or state-change materials.

Figure 3A:
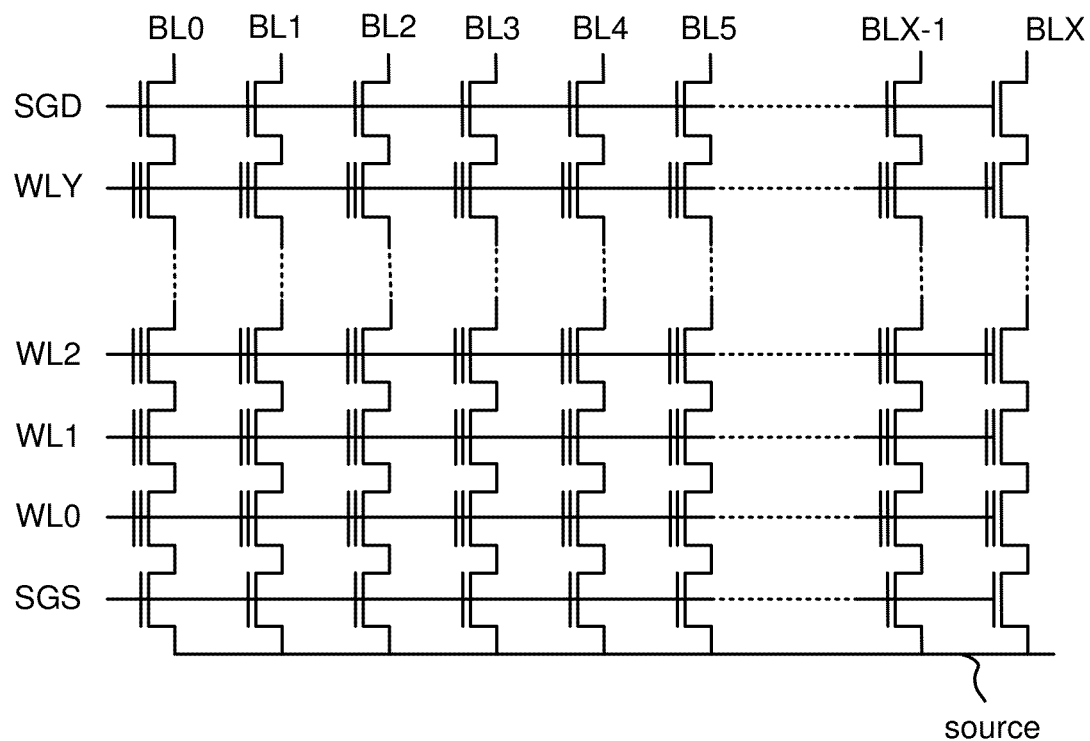
FIG. 3A depicts one embodiment of a memory block including a plurality of NAND strings.

FIG. 3A depicts one embodiment of a memory block including a plurality of NAND strings. As depicted, each NAND string includes (Y+1) memory cells. Each NAND string is connected to one bit line out of (X+1) bit lines on the drain side (i.e., one bit line of bit lines BL0-BLX) via a drain-side select gate controlled by the drain-side selection signal SGD. Each NAND string is connected to a source line (source) via a source-side select gate controlled by source-side selection signal SGS. In one embodiment, the source-side select gate controlled by source-side selection signal SGS and the drain-side select gate controlled by the drain-side selection signal SGD may be fabricated using the technology described herein.

In some embodiments, in order to save space on a semiconductor die, two adjacent NAND strings (or other grouping in memory cells) may share a common bit line (i.e., a shared-bit-line memory architecture). In some cases, more than two NAND strings may share a common bit line. In one example, the signal SGD may be replaced by two drain-side selection signals SGD1 and SGD2. Each NAND string of the pair would then have two drain-side select gates, each connected to a different drain-side selection signal of the two drain side selection signals SGD1 and SGD2. One of the two drain-side select gates for each NAND string may be a depletion mode transistor with its threshold voltage lower than 0 volts. One potential problem with using two select gates on the drain side of each NAND string is that two drain-side select gates (as compared to one drain-side select transistor) requires more area on the die. Therefore, from an integrated circuit area standpoint, it may be beneficial to only use one drain-side selection gate for each NAND string and then connect each NAND string of the pair with only one of the two drain-side selection signals.

One benefit of a shared-bit-line NAND architecture is that it relieves the bit line pitch by 2× since pairing NAND strings with a common bit line allows the total number of bit lines to be cut in half. The increase in bit line pitch for a given process geometry allows for less resistive bit line contacts and the reduced total number of bit lines allows for reduced bit line resistance and/or reduced bit line to bit line capacitance between adjacent bit lines. More information regarding the shared-bit-line memory architecture can be found in U.S. Provisional Application 61/561,286, "Improved Operation for Non-Volatile Storage System With Shared Bit Lines Connected to Single Selection Device" and U.S. Provisional Application 61/422,385, "Non-Volatile Storage System With Shared Bit Lines Connected to Single Selection Device," both of which are herein incorporated by reference in their entirety.

Figure 3B:
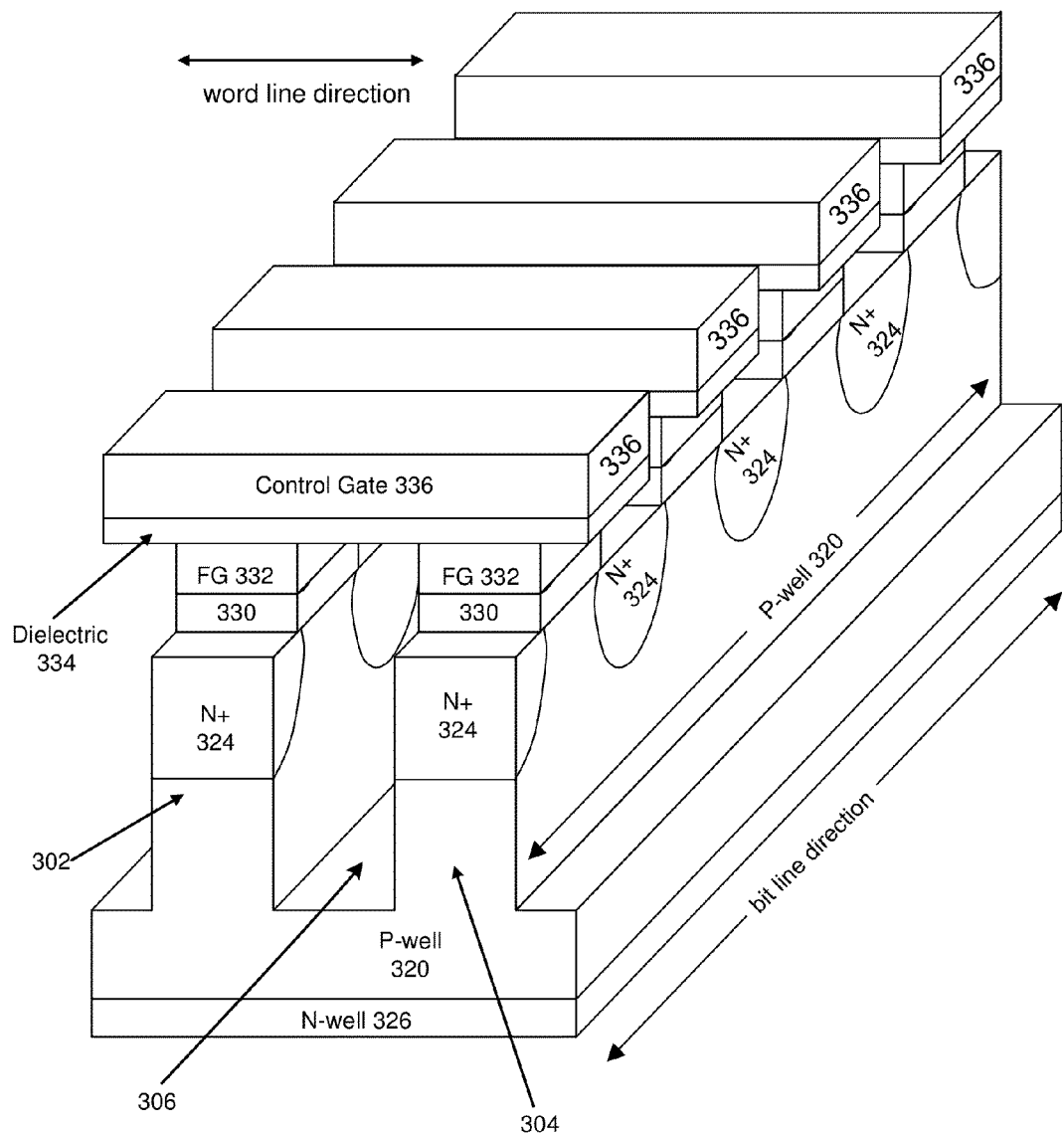
FIG. 3B depicts one embodiment of two NAND strings that may be fabricated as part of a larger flash memory array.

FIG. 3B depicts one embodiment of two NAND strings 302 and 304 that may be fabricated as part of a larger flash memory array using the technology described herein. As depicted, NAND strings 302 and 304 each include four memory cells, n-type diffusions 324, and a portion of a shared P-well 320. Each memory cell in a NAND string corresponds with a floating gate 332 isolated by dielectric layers 334 and 330. N-well 326 is below P-well 320. The bit line direction (or y-direction) runs in the direction of the NAND strings, and the word line direction (or x-direction) runs perpendicular to the NAND strings or the bit line direction. The word line direction may be referred to as the row direction and the bit line direction may be referred to as the column direction. In some cases, the N-well 326 may sit in a P-type substrate (not depicted). As depicted, NAND string 302 is separated from NAND string 304 by an isolation region 306. The isolation region 306 may include an insulating material or dielectric between adjacent NAND strings (not depicted). Typically, shallow trench isolation (STI) is used to isolate adjacent NAND strings (e.g., using an active area STI). In one embodiment, the control gates 336 correspond with word lines, such as word lines WL0-WLY of FIG. 3A.

Figure 4:
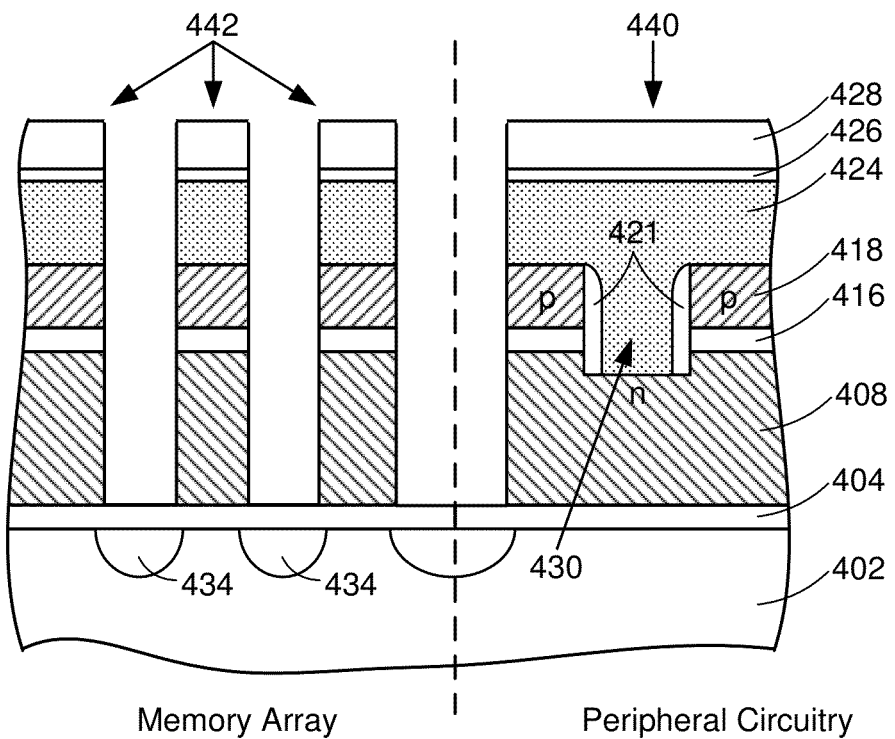
FIG. 4 depicts one embodiment of a portion of a NAND string using a cross-sectional view in the bit line direction.

FIG. 4 depicts one embodiment of a portion of a NAND string using a cross-sectional view in the bit line direction. As depicted, the portion of the NAND string includes floating gate transistor stacks 442 and peripheral transistor stack 440. The peripheral transistor stack 440 includes two sidewall diffusion barriers 421 within an EI cutout region 430. The EI cutout region 430 extends from a second control gate layer 424 through a first control gate layer 418, through an inter-poly dielectric (IPD) layer 416, and through a portion of a floating gate layer 408. The filling of the EI cutout region 430 with the second control gate layer 424 effectively shorts (or connects) the second control gate layer 424 to the floating gate layer 408. The NAND string includes diffusions 434, tunneling dielectric layer 404, and substrate (or well) 402. A tungsten nitride layer 426 and a tungsten layer 428 may be deposited over the second control gate layer 424. The second control gate layer 424 may comprise non-doped polysilicon.

As depicted, the first control gate layer 418 may be doped with p-type impurities and the floating gate layer 408 may be doped with n-type impurities. One issue with fabricating a peripheral transistor using an n-type floating gate layer 408 and a p-type first control gate layer 418 is that a parasitic bipolar device (e.g., a PNP device) may be formed due to the diffusion of ions (e.g., boron ions) from the first control gate layer 418 into the EI cutout region 430. The presence of sidewall diffusion barriers 421 may prevent the formation of a parasitic bipolar device or other depletion regions within the EI cutout region 430, thereby reducing the gate resistance and/or EI resistance associated with peripheral transistors. In one embodiment, the sidewall diffusion barriers 421 comprise silicon nitride sidewalls.

Figure 5:
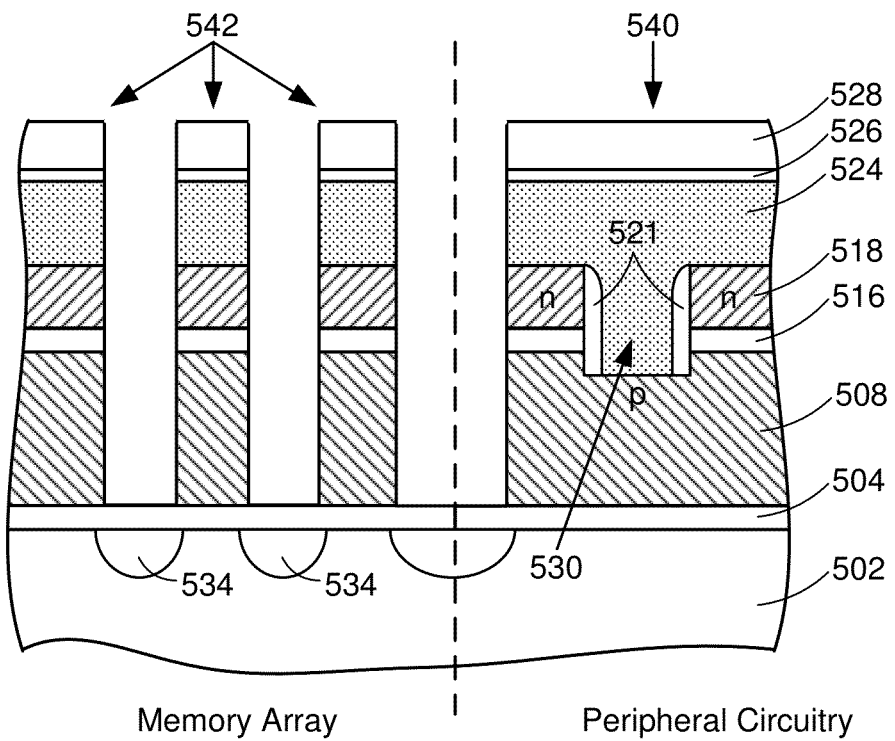
FIG. 5 depicts one embodiment of a portion of a NAND string using a cross-sectional view in the bit line direction.

FIG. 5 depicts one embodiment of a portion of a NAND string using a cross-sectional view in the bit line direction. As depicted, the portion of the NAND string includes floating gate transistor stacks 542 and peripheral transistor stack 540. The peripheral transistor stack 540 includes two sidewall diffusion barriers 521 within an EI cutout region 530. The EI cutout region 530 extends from a second control gate layer 524 through a first control gate layer 518, through an inter-poly dielectric (IPD) layer 516, and through a portion of a floating gate layer 508. The filling of the EI cutout region 530 with the second control gate layer 524 effectively shorts (or connects) the second control gate layer 524 to the floating gate layer 508. The NAND string includes diffusions 534, tunneling dielectric layer 504, and substrate (or well) 502. A tungsten nitride layer 562 and a tungsten layer 528 may be deposited over the second control gate layer 524. The second control gate layer 524 may comprise non-doped polysilicon.

As depicted, the first control gate layer 518 may be doped with n-type impurities and the floating gate layer 508 may be doped with p-type impurities. One issue with fabricating a peripheral transistor using a p-type floating gate layer 508 and an n-type first control gate layer 518 is that a parasitic bipolar device (e.g., an NPN device) may be formed due to the diffusion of ions (e.g., phosphorus or arsenic ions) from the first control gate layer 518 into the EI cutout region 530. The presence of sidewall diffusion barriers 521 may prevent the formation of a parasitic bipolar device or other depletion regions within the EI cutout region 530, thereby reducing the gate resistance and/or EI resistance associated with peripheral transistors. In one embodiment, the sidewall diffusion barriers 521 comprise silicon nitride sidewalls. In other embodiments, the sidewall diffusion barriers 521 comprise silicon oxide sidewalls.

Figure 6:
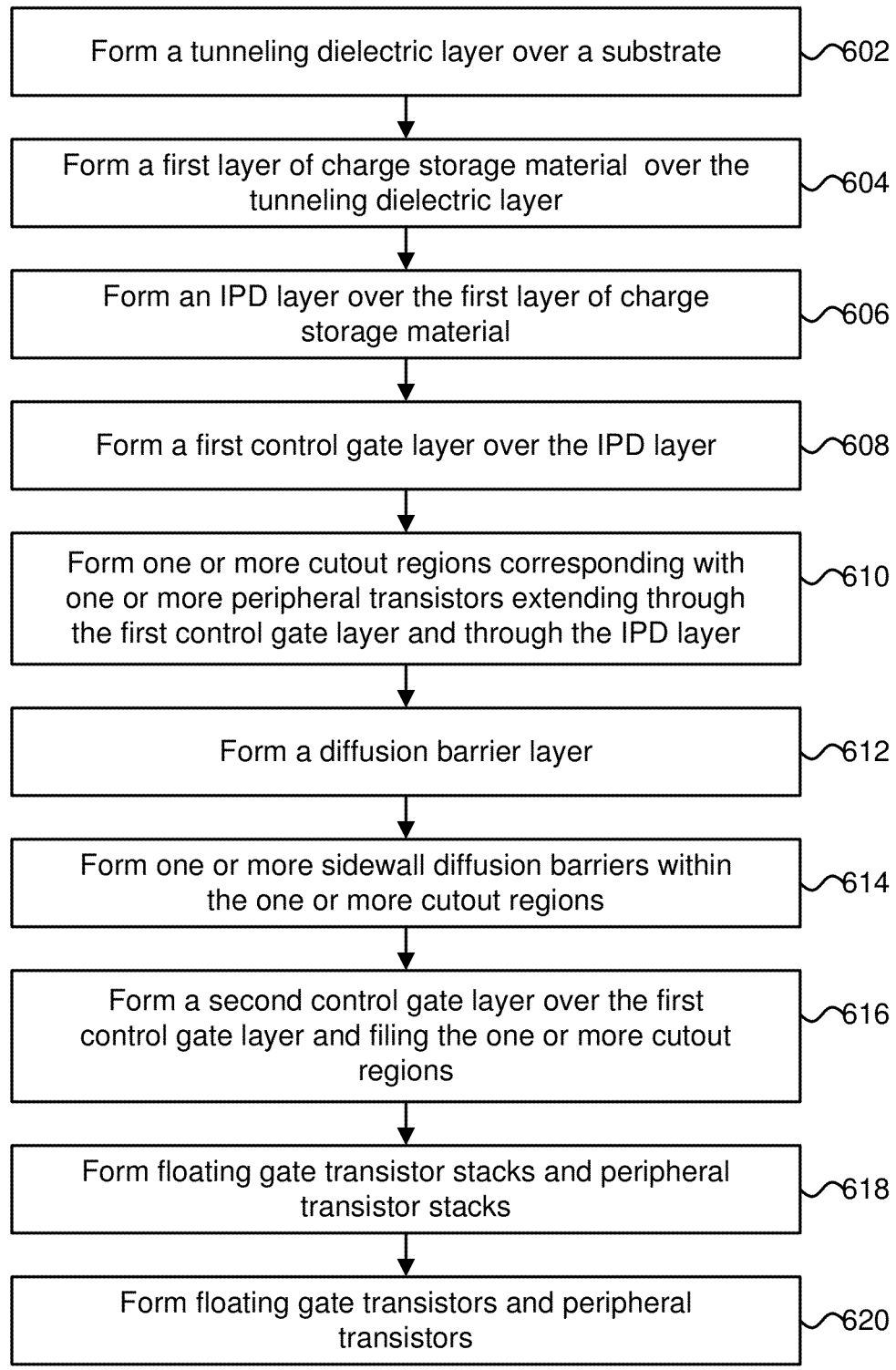
FIG. 6 is a flowchart describing one embodiment of a process for fabricating a portion of a non-volatile memory device including one or more peripheral transistors.

FIG. 6 is a flowchart describing one embodiment of a process for fabricating a portion of a non-volatile memory device including one or more peripheral transistors. The flowchart may omit common processing steps (e.g., the formation of STI structures to isolate adjacent NAND strings, various implant and annealing steps, the formation of vias/contacts, the formation of a passivation layer, planarization, etc.) in order to highlight the processing steps described.

FIGS. 7A-7H depict one embodiment of a process for fabricating a portion of a non-volatile memory device including one or more peripheral transistors. FIGS. 7A-7H depict various stages of fabrication using cross-sectional views in the bit line direction and may be referred to when describing the process of FIG. 6.

Referring to FIG. 6, in step 602, a tunneling dielectric layer is formed on or above a substrate. The tunneling dielectric layer may comprise a thin oxide or a thin nitride oxide. The thin oxide may be formed using a thermal oxidation process. In some embodiments, the thickness of the tunneling dielectric layer may be between 5 nm and 15 nm. In some cases, one or more areas of the peripheral circuitry region may undergo additional processing steps in order to form a thicker dielectric for various transistors such as logic gates and/or high-voltage transistors (e.g., a thicker gate oxide between 20 nm and 100 nm).

In step 604, a first layer of charge storage material is formed on or above the tunneling dielectric layer. In one embodiment, the first layer of charge storage material may include a polycrystalline silicon film (or polysilicon). The first layer of charge storage material may be deposited on or above the tunneling dielectric layer in order to eventually form floating gates. The first layer of charge storage material may be deposited using various deposition techniques such as chemical vapor deposition (CVD), physical vapor deposition (PVD), or atomic layer deposition (ALD). In some cases, the thickness of the first layer of charge storage material may be between 50 nm and 150 nm.

In some embodiments, the first layer of charge storage material may be doped in-situ (i.e., may be doped while being grown). The first layer of charge storage material may also be doped after being deposited via diffusion doping or ion implantation. In one embodiment, the first layer of charge storage material may be doped with an n-type dopant (e.g., phosphorus or arsenic). In another embodiment, the first layer of charge storage material may be doped with a p-type dopant (e.g., boron). In one embodiment, the first layer of charge storage material comprises a boron-doped floating gate. The use of a p-type charge storage material may increase the threshold voltage of a corresponding transistor.

In step 606, an inter-poly dielectric (IPD) layer is formed. In one embodiment, the IPD layer may be formed on or above the first layer of charge storage material. In other embodiments, other charge storage layers may be formed between the first layer of charge storage material and the IPD layer. In some cases, the IPD layer may include one or more layers. In one example, the IPD layer may include a multi-layer dielectric film such as an ONO dielectric stack, which includes alternating layers of silicon dioxide ("O") and silicon nitride ("N").

In step 608, a first control gate layer is formed on or above the IPD layer. In one embodiment, the first control gate layer may include polysilicon. The first control gate layer may be deposited on or above the IPD layer in order to eventually form lower portions of control gates. The first control gate layer may be deposited using various deposition techniques such as chemical vapor deposition (CVD), physical vapor deposition (PVD), or atomic layer deposition (ALD). In some cases, the first control gate layer may be doped in-situ (i.e., may be doped while being grown). The first control gate layer may also be doped after being deposited via diffusion doping or ion implantation. In one embodiment, the first control gate layer may be doped with an n-type dopant (e.g., phosphorus or arsenic). In another embodiment, the first control gate layer may be doped with a p-type dopant (e.g., boron).

In one embodiment, the first layer of charge storage material may be of a first conductivity type and the first control gate layer may be of a second conductivity type different from the first conductivity type. In one example, the first layer of charge storage material may comprise an n-type material and the first control gate layer may comprise a p-type material. In another example, the first layer of charge storage material may comprise a p-type material and the first control gate layer may comprise an n-type material.

A conductivity type may refer to the majority charge carriers within a material. The majority charge carriers within a p-type material are holes and the majority charge carriers within an n-type material are electrons.

Figure 7A:
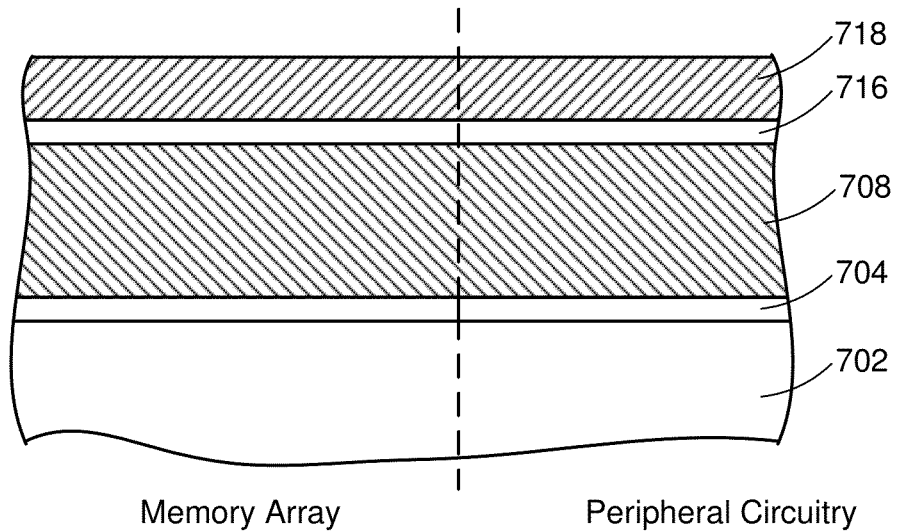
FIGS. 7A-7H depict one embodiment of a process for fabricating a portion of a non-volatile memory device including one or more peripheral transistors.

FIG. 7A depicts a cross-sectional view of one embodiment after step 608 has been performed. As depicted, a first control gate layer 718 has been formed on an IPD layer 716. The IPD layer 716 has been formed on a floating gate layer 708. The floating gate layer 708 has been formed on a tunneling dielectric layer 704. The tunneling dielectric layer 704 has been formed on a substrate (or well) 702.

Referring to FIG. 6, in step 610, one or more cutout regions corresponding with one or more peripheral transistors are formed extending through the first control gate layer and through the IPD layer. The one or more cutout regions (or openings) may be formed over areas in which the one or more peripheral transistors will eventually be formed. The peripheral transistors (or non-floating-gate transistors) may include select gate transistors (e.g., drain-side select gates and/or source-side select gates) and/or logic transistors. One purpose for the one or more cutouts is to form peripheral transistors that do not have the IPD layer forming a barrier between the first control gate layer and the first layer of charge storage material (i.e., the IPD layer may be removed so that the peripheral transistors do not have a floating gate). In one embodiment, the one or more cutout regions may extend through the first control gate layer, through the IPD layer, and through a portion of the first control gate layer.

The one or more cutout regions may be formed by patterning and then removing material using various etching techniques such as dry etching, wet chemical etching, plasma etching, or reactive-ion etching (RIE). In some cases, the widths of the one or more cutout regions may be between 40 nm and 80 nm. An anisotropic etch may be used to produce cutout regions with substantially vertical sidewalls. In some cases, the selective removal of material may be performed using a lithography sequence including depositing a layer of photoresist (positive or negative) over the material, exposing the layer of photoresist to light via a mask (i.e., the mask determines which areas of the layer of photoresist are exposed to the light), and then selectively etching the material based on the exposed portions of the layer of photoresist.

Figure 7B:
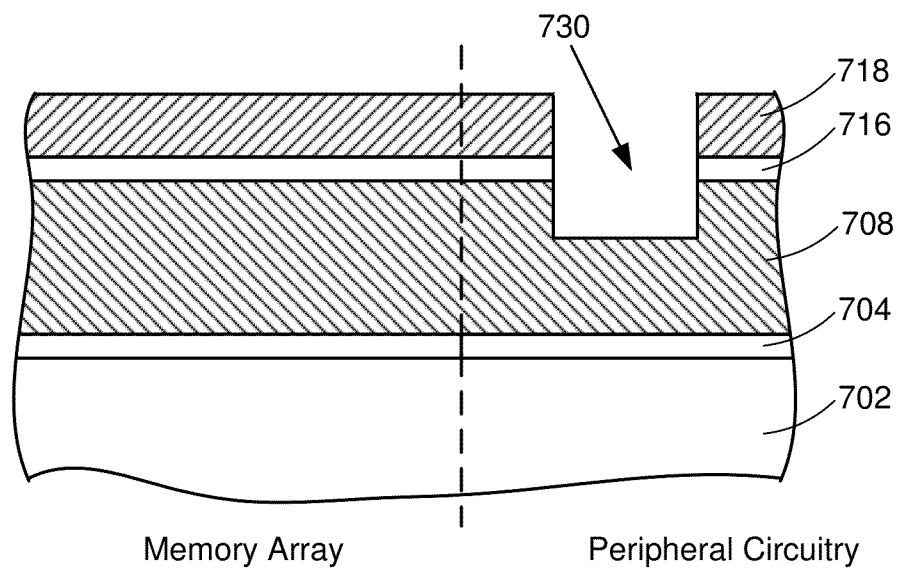

FIG. 7B depicts a cross-sectional view of one embodiment after step 610 has been performed. As depicted, a cutout region 730 extends through the first control gate layer 718, through the IPD layer 716, and into a portion of the floating gate layer 708.

Referring to FIG. 6, in step 612, a diffusion barrier layer is formed by conformally depositing the diffusion barrier layer over the first control gate layer and along the sidewalls and bottom surfaces of the one or more cutout regions. In one embodiment, the diffusion barrier layer includes silicon nitride. In another embodiment, the diffusion barrier layer includes silicon dioxide. In some cases, the thickness of the diffusion barrier layer may be between 5 nm and 15 nm.

Figure 7C:
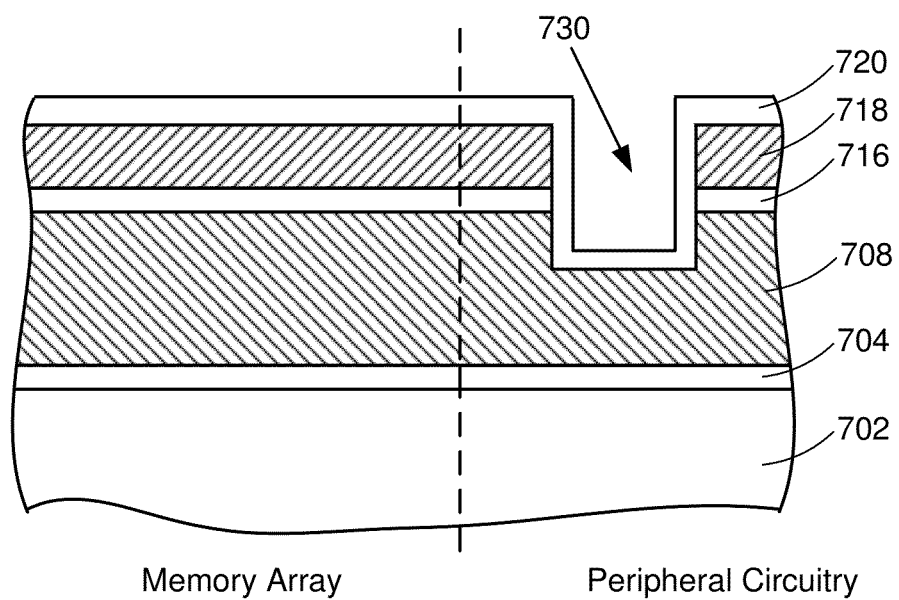

FIG. 7C depicts a cross-sectional view of one embodiment after step 612 has been performed. As depicted, a layer of silicon nitride has been conformally deposited over the first control gate layer 718 and along the sidewalls and bottom surfaces of the cutout region 730.

Referring to FIG. 6, in step 614, the diffusion barrier layer is anisotropically etched to form one or more sidewall diffusion barriers within the one or more cutout regions. One way to prevent the formation of a parasitic bipolar device or other depletion regions within a cutout region is to provide one or more sidewall diffusion barriers within the cutout region. The one or more sidewall diffusion barriers may prevent ions from the first control gate layer from diffusing into the one or more cutout regions. In one example, a sidewall diffusion barrier may prevent boron ions from diffusing from the first control gate layer into a cutout region (or opening). By preventing the formation of a parasitic bipolar device or other depletion regions within the one or more cutout regions, the gate resistance and/or EI resistance associated with peripheral transistors may be reduced. In one embodiment, the one or more sidewall diffusion barriers include silicon nitride sidewalls. In another embodiment, the one or more sidewall diffusion barriers include silicon dioxide sidewalls.

Figure 7D:
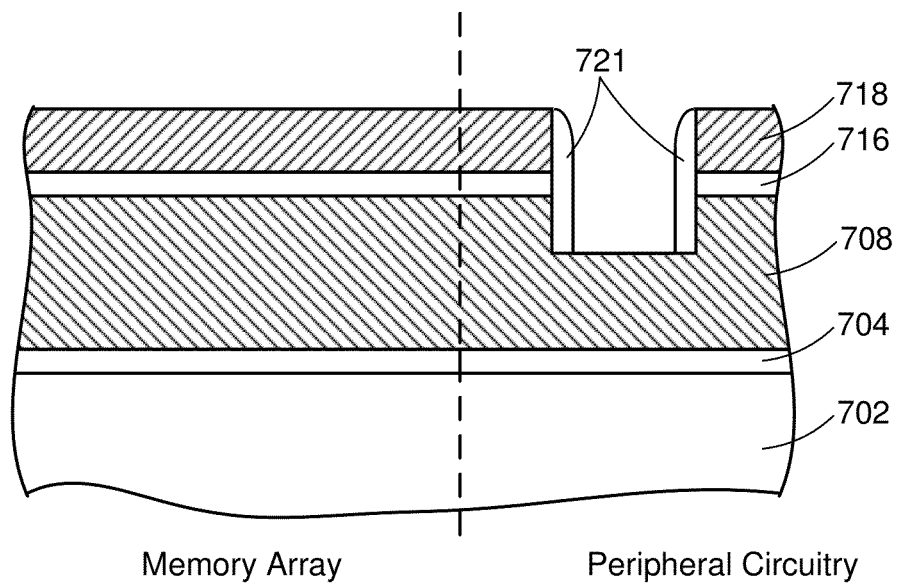

FIG. 7D depicts a cross-sectional view of one embodiment after step 614 has been performed. As depicted, silicon nitride sidewall barriers 721 have been formed within the cutout region 730.

Referring to FIG. 6, in step 616, a second control gate layer is formed on or above the first control gate layer and fills the one or more cutout regions. The filling of the one or more cutout regions effectively shorts (or connects) the second control gate layer to the first layer of charge storage material. The filling of the one or more cutout regions may be performed subsequent to the forming of the one or more sidewall diffusion barriers within the one or more cutout regions. The second control gate layer may form upper portions of control gates and the first control gate layer may form lower portions of the control gates. In one embodiment, the second control gate layer may include non-doped polysilicon. In another embodiment, the second control gate layer may include an n-type material.

Figure 7E:
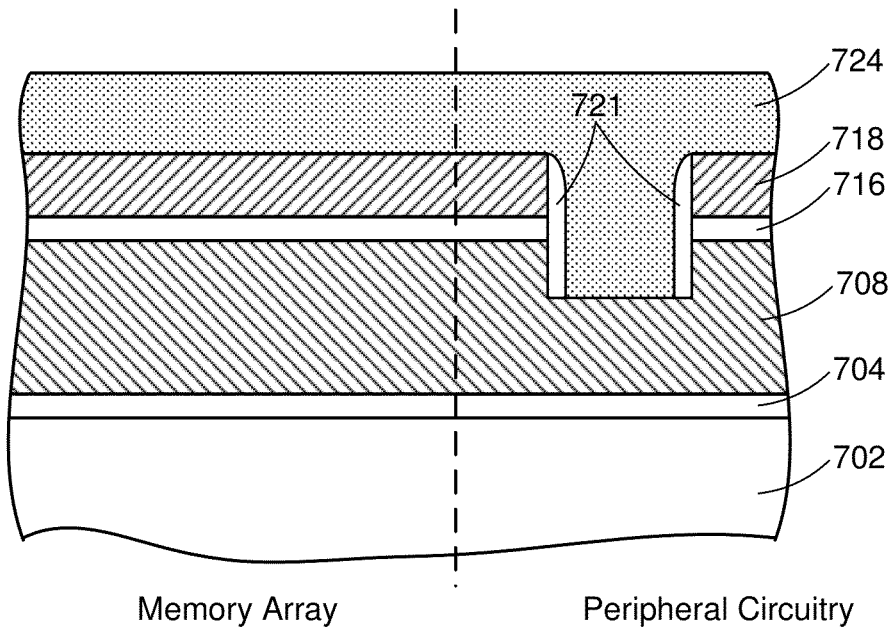

FIG. 7E depicts a cross-sectional view of one embodiment after step 616 has been performed. As depicted, a non-doped layer of polysilicon has been formed over the first control gate layer 718 and fills the cutout region 730.

In some embodiments, a silicide layer or a refractory metal layer may be formed over the second control gate layer. These additional layers may be used to reduce word line resistance. In one example, the refractory metal layer may include tungsten, tungsten silicide, and/or tungsten nitride. The silicide layer and/or refractory metal layer may be deposited using PVD (e.g., via sputtering).

Figure 7F:
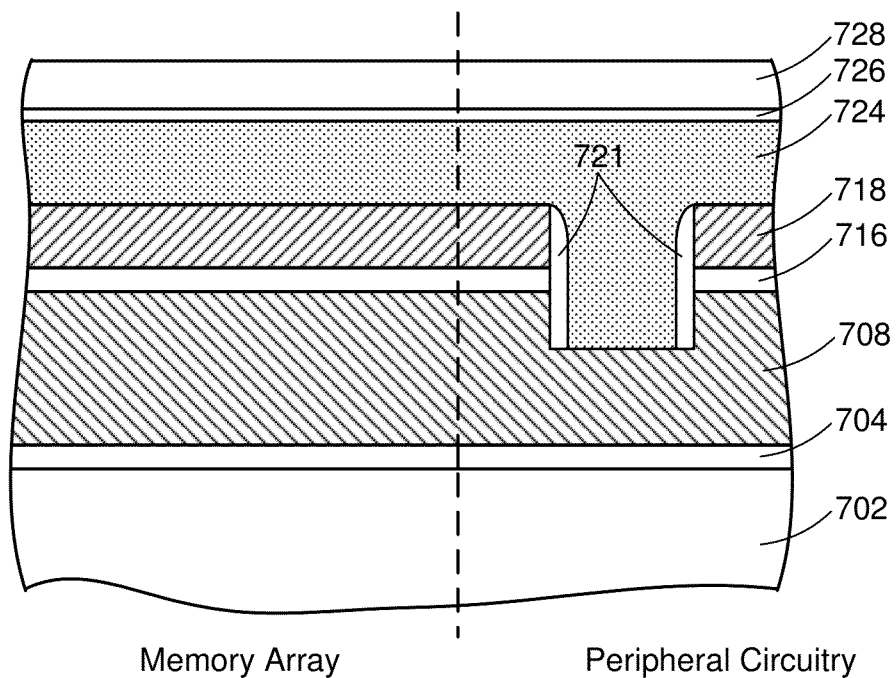

FIG. 7F depicts a cross-sectional view of one embodiment after a layer of tungsten nitride 726 and a layer of tungsten 728 have been formed over the second control gate layer 724.

Referring to FIG. 6, in step 618, floating gate transistor stacks and peripheral transistor stacks are formed. In one embodiment, a first masking layer and a second masking layer are formed over the second control gate layer. The second masking layer may be formed over the first masking layer and include tetraethyl orthosilicate (TEOS), silicon dioxide, or silicon nitride. The second masking layer may be used for patterning and then etching isolation regions between floating gate transistors and/or peripheral transistors, thereby creating the floating gate transistor stacks and the peripheral transistor stacks. The etching of the isolation regions may be performed until the tunneling dielectric layer is reached. The patterning of the second masking layer may include multiple patterning lithography techniques (e.g., spacer-based double patterning). In one embodiment, a single masking layer including a silicon nitride layer is deposited over the second control gate layer and patterned as a silicon nitride hardmask. The isolation regions may be filled with an insulating material such as silicon dioxide or TEOS. In some cases, air gaps may also be formed within the isolation regions.

Figure 7G:
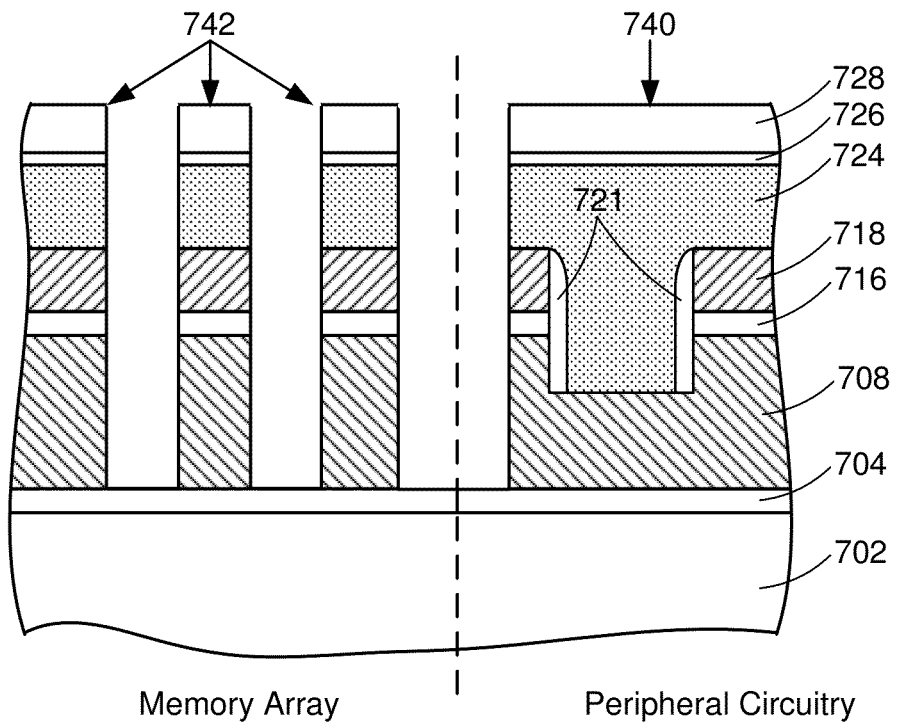

FIG. 7G depicts a cross-sectional view of one embodiment after step 618 has been performed. As depicted, floating gate transistor stacks 742 are formed in a memory array region and peripheral transistor stack 740 has been formed in a peripheral circuitry region.

In step 620, floating gate transistors and peripheral transistors are formed by forming source/drain junctions between the floating gate transistor stacks and/or the peripheral transistor stacks. In some cases, the first masking layer may be used during doping (e.g., via ion implantation) of the source/drain junctions associated with the floating gate transistors and/or the peripheral transistors. In one embodiment, the junctions associated with the floating gate transistors and the peripheral transistors are doped with an n-type dopant (e.g., phosphorus or arsenic).

Figure 7H:
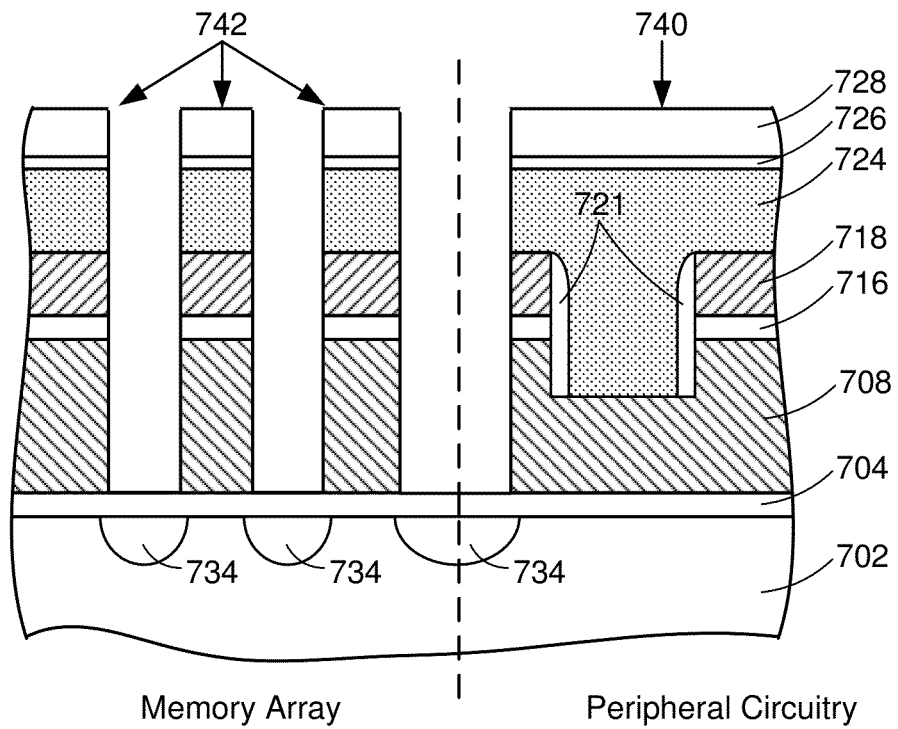

FIG. 7H depicts a cross-sectional view of one embodiment after step 620 has been performed. As depicted, diffusion regions 734 have been formed between the floating gate transistor stacks 742 and/or the peripheral transistor stack 740, thereby creating a portion of a NAND string including a peripheral transistor associated with the peripheral transistor stack 740.

Figure 8:
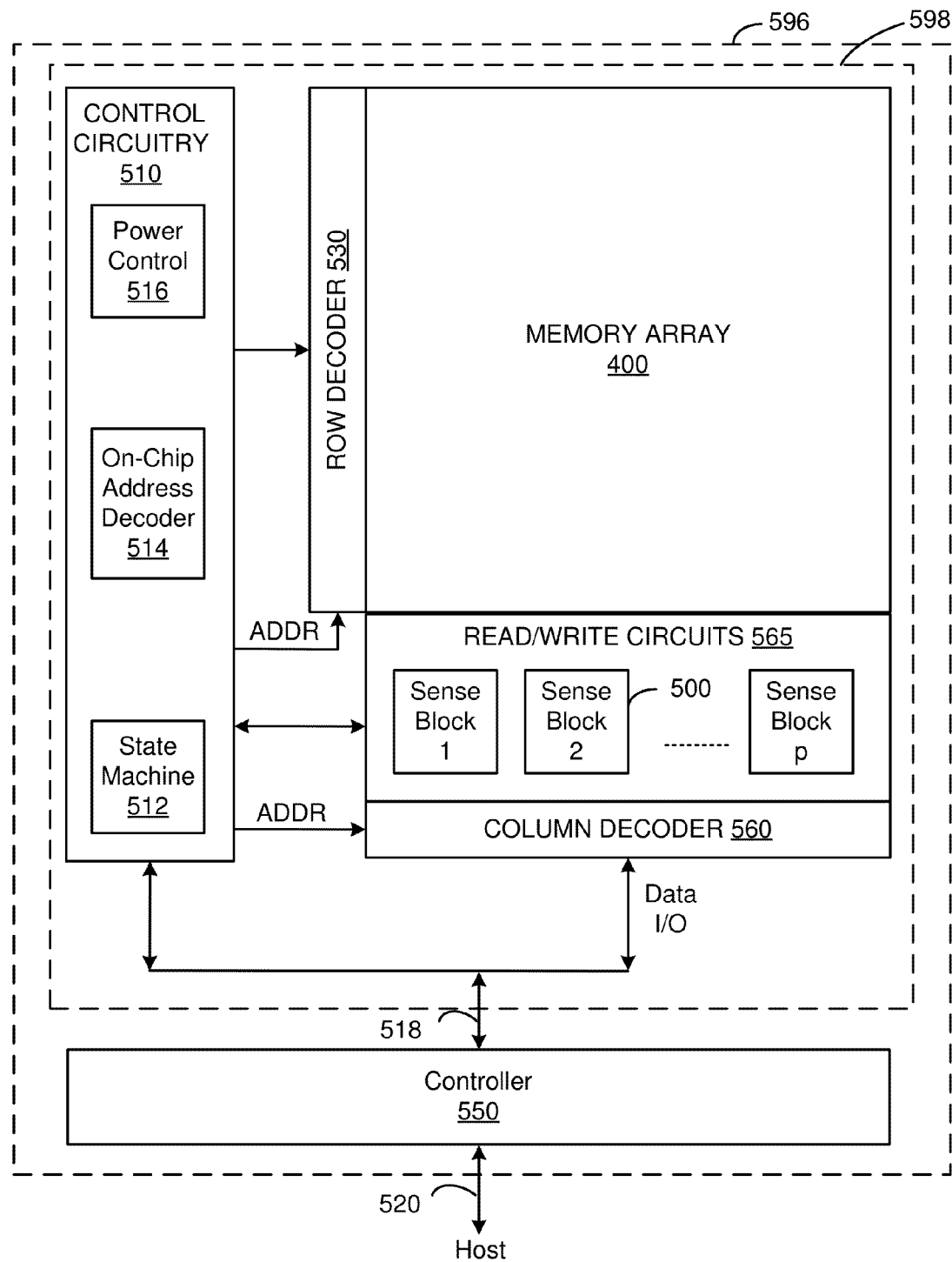
FIG. 8 depicts one embodiment of a non-volatile storage system.

The technology described herein may be used to manufacture portions of a non-volatile storage system. FIG. 8 depicts one embodiment of a non-volatile storage system 596 including read/write circuits for reading and programming a page (or other unit) of memory cells (e.g., NAND multi-level cells) in parallel. As depicted, non-volatile storage system 596 includes a memory die 598 and controller 550. Memory die 598 includes a memory array 400 (e.g., a NAND flash memory array), control circuitry 510, row decoder 530, column decoder 560, and read/write circuits 565. In one embodiment, access to the memory array 400 by the various peripheral circuits (e.g., row decoders or column decoders) is implemented in a symmetric fashion, on opposite sides of the array, so that the densities of access lines and circuitry on each side are reduced by half. The memory array 400 is addressable by word lines via a row decoder 530 and by bit lines via a column decoder 560. Word lines and bit lines are examples of memory array control lines. The read/write circuits 565 include multiple sense blocks 500 that allow a page of storage elements to be read or programmed in parallel. In some cases, controller 550 may be integrated on the memory die 598. Commands and data are transferred between the host and controller 550 via lines 520 and between the controller 550 and the memory die 598 via lines 518.

The control circuitry 510 cooperates with the read/write circuits 565 to perform memory operations on the memory array 400. The control circuitry 510 includes a state machine 512, an on-chip address decoder 514, and a power control module 516. The state machine 512 provides chip-level control of memory operations. The on-chip address decoder 514 provides an address interface between that used by the host or a memory controller to the hardware address used by the decoders 530 and 560. The power control module 516 controls the power and voltages supplied to the word lines and bit lines during memory operations. In one embodiment, a power control module 516 includes one or more charge pumps that can create voltages larger than the supply voltage.

In some embodiments, one or more of the components (alone or in combination), other than memory array 400, may be referred to as a managing or control circuit. For example, one or more managing or control circuits may include any one of or a combination of control circuitry 510, state machine 512, decoders 530/560, power control 516, sense blocks 500, read/write circuits 565, controller 550, and so forth. The one or more managing circuits may perform or facilitate one or more memory array operations including erasing, programming, or reading operations.

In one embodiment, memory array 400 may be divided into a large number of blocks (e.g., blocks 0-1023, or another amount) of memory cells. As is common for flash memory systems, the block may be the unit of erase. That is, each block may contain the minimum number of memory cells that are erased together. Other units of erase can also be used. A block contains a set of NAND strings which are accessed via bit lines and word lines. Typically, all of the NAND strings in a block share a common set of word lines.

Each block may be divided into a particular number of pages. In one embodiment, a page may be the unit of programming. Other units of programming can also be used. One or more pages of data are typically stored in one row of memory cells. For example, one or more pages of data may be stored in memory cells connected to a common word line. In one embodiment, the set of memory cells that are connected to a common word line are programmed simultaneously. A page can store one or more sectors. A sector may include user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECC and/or other overhead data may be stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages, and sectors can also be used.

Figure 9:
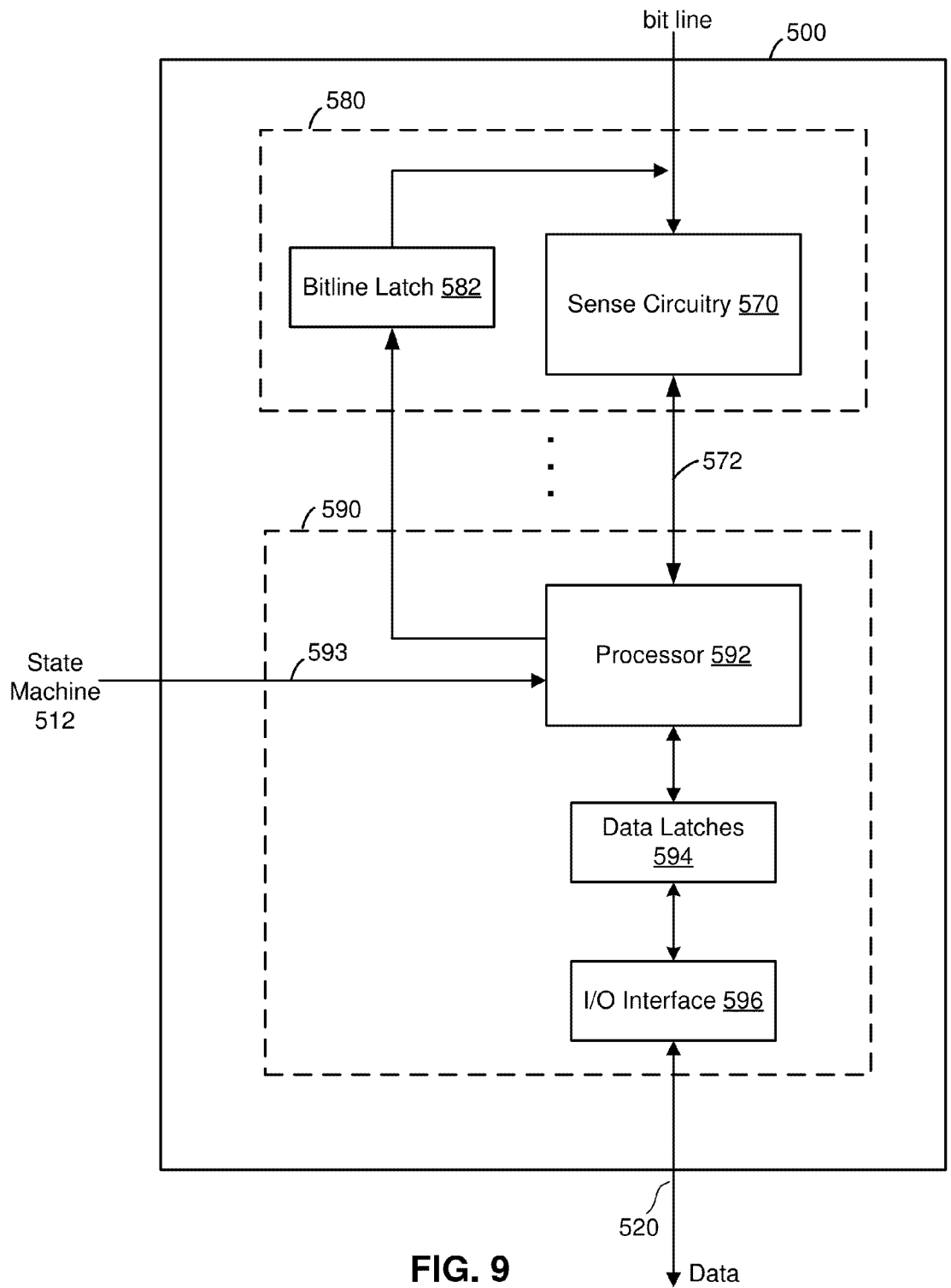
FIG. 9 depicts one embodiment of a sense block.

FIG. 9 depicts one embodiment of a sense block 500, such as sense block 500 in FIG. 8. An individual sense block 500 may be partitioned into a core portion, referred to as a sense module 580, and a common portion 590. In one embodiment, there is a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 may result in the connected bit line being pulled to a state designating program inhibit voltage (e.g., 1.5-3 V).

Common portion 590 comprises a processor 592, a set of data latches 594, and an I/O Interface 596 coupled between the set of data latches 594 and data bus 520. Processor 592 performs computations. For example, processor 592 may determine the data stored in the sensed storage element and store the determined data in the set of data latches. The set of data latches 594 may be used to store data bits determined by processor 592 during a read operation or to store data bits imported from the data bus 520 during a program operation. The imported data bits represent write data meant to be programmed into a memory array, such as memory array 400 in FIG. 8. I/O interface 596 provides an interface between data latches 594 and the data bus 520.

During a read operation or other storage element sensing operation, a state machine, such as state machine 512 of FIG. 8, controls the supply of different control gate voltages to the addressed storage elements. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves both as a latch for latching the output of the sense module 580 and as a bit line latch as described above.

During a programming operation, the data to be programmed is stored in the set of data latches 594. The programming operation, under the control of the state machine 512, comprises a series of programming voltage pulses applied to the control gates of the addressed storage elements. Each program pulse is followed by a read back (or verify process) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit voltage. This inhibits the storage element coupled to the bit line from further programming even if program pulses appear on its control gate. In other embodiments, the processor initially loads the bit line latch 582 and the sense circuitry sets it to an inhibit value during the verify process.

Data latch stack 594 contains a stack of data latches corresponding to the sense module. In one embodiment, there are three data latches per sense module 580. The data latches can be implemented as a shift register so that the parallel data stored therein is converted to serial data for data bus 520, and vice-versa. All the data latches corresponding to a read/write block can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

One embodiment of the disclosed technology includes forming a first layer of charge storage material, forming a dielectric layer over the first layer of charge storage material, forming a first control gate layer over the dielectric layer, forming one or more cutout regions extending through the first layer of charge storage material and the dielectric layer, forming one or more diffusion barriers within the one or more cutout regions, and forming a second control gate layer over the first control gate layer subsequent to the forming one or more diffusion barriers.

The second control gate layer may fill the one or more cutout regions. The first layer of charge storage material may include material of a first conductivity type and the first control gate layer may include material of a second conductivity type different from the first conductivity type.

One embodiment of the disclosed technology includes a transistor including a floating gate layer, a dielectric layer over the floating gate player, a first control gate layer over the dielectric layer, and a cutout region. The cutout region extends through the first control gate layer and the dielectric layer. The cutout region extends through a portion of the floating gate layer. The cutout region includes one or more sidewall diffusion barriers within the cutout region. The transistor includes a second control gate layer over the first control gate layer. The second control gate layer fills the cutout region.

One embodiment of the disclosed technology includes forming a floating gate layer, forming a dielectric layer over the floating gate player, forming a first control gate layer over the dielectric layer, and etching a cutout region. The cutout region extends through the first control gate layer and the dielectric layer. The cutout region extends through a portion of the floating gate layer. The method further includes forming one or more sidewall diffusion barriers within the cutout region and forming a second control gate layer over the first control gate layer subsequent to the forming one or more sidewall diffusion barriers. The second control gate layer fills the cutout region.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection can be a direct connection or an indirect connection (e.g., via another part). The use of the terms coupled and connected may refer to a direct connection or an indirect connection.

For purposes of this document, the term "set" of objects refers to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A semiconductor device, comprising:
   a floating gate layer;
   a dielectric layer over the floating gate layer;
   a first control gate layer over the dielectric layer;
   a cutout region, the cutout region extends through the first control gate layer and the dielectric layer, the cutout region includes one or more sidewall diffusion barriers within the cutout region; and
   a second control gate layer over the first control gate layer and within the cutout region such that the second control gate layer directly contacts the floating gate layer without any intervening layers between the second control gate layer and the floating gate layer.

2. The semiconductor device of claim 1, wherein:
   the floating gate layer includes material of a first conductivity type; and
   the first control gate layer includes material of a second conductivity type different from the first conductivity type.

3. The semiconductor device of claim 1, wherein:
   the floating gate layer comprises an n-type material; and
   the first control gate layer comprises a p-type material.

4. The semiconductor device of claim 1, wherein:
   the floating gate layer comprises a p-type material; and
   the first control gate layer comprises an n-type material.

5. The semiconductor device of claim 1, wherein:
   the one or more sidewall diffusion barriers include a first sidewall diffusion barrier that extends through the first control gate layer and the dielectric layer.

6. The semiconductor device of claim 1, wherein:
   the one or more sidewall diffusion barriers comprise a silicon nitride sidewall.

7. The semiconductor device of claim 1, wherein:
   the one or more sidewall diffusion barriers comprise a silicon oxide sidewall.

8. The semiconductor device of claim 1, wherein:
   the cutout region extends to a top of the floating gate layer.

9. The semiconductor device of claim 1, wherein:
   the cutout region extends through a portion of the floating gate layer.

10. The semiconductor device of claim 1, wherein:
    the second control gate layer comprises non-doped polysilicon.

11. A semiconductor device, comprising:
    a first layer of charge storage material;

a dielectric layer located above the first layer of charge storage material;

a first control gate layer located above the dielectric layer;

a cutout region, the cutout region extends through the first control gate layer and the dielectric layer, the cutout region includes one or more sidewall diffusion barriers within the cutout region; and a second control gate layer located above the first control gate layer and located within the cutout region such that the second control gate layer abuts the first layer of charge storage material without any intervening layers between the second control gate layer and the first layer of charge storage material.

12. The semiconductor device of claim 11, wherein:
the first layer of charge storage material includes material of a first conductivity type; and
the first control gate layer includes material of a second conductivity type different from the first conductivity type.

13. The semiconductor device of claim 11, wherein:
the first layer of charge storage material comprises an n-type material; and
the first control gate layer comprises a p-type material.

14. The semiconductor device of claim 11, wherein:
the first layer of charge storage material comprises a p-type material; and
the first control gate layer comprises an n-type material.

15. The semiconductor device of claim 11, wherein:
the one or more sidewall diffusion barriers include a first sidewall diffusion barrier that extends through the first control gate layer and the dielectric layer.

16. The semiconductor device of claim 11, wherein:
the one or more sidewall diffusion barriers comprise a silicon nitride sidewall.

17. The semiconductor device of claim 11, wherein:
the one or more sidewall diffusion barriers comprise a silicon oxide sidewall.

18. The semiconductor device of claim 11, wherein:
the cutout region extends to a top of the first layer of charge storage material.

19. The semiconductor device of claim 11, wherein:
the cutout region extends through a portion of the first layer of charge storage material.

20. A transistor, comprising:
a first layer of charge storage material, the first layer of charge storage material includes material of a first conductivity type;

a first control gate layer arranged above the first layer of charge storage material, the first control gate layer includes material of a second conductivity type different from the first conductivity type;

a dielectric layer arranged between the first layer of charge storage material and the first control gate layer;

a cutout region, the cutout region extends through the first control gate layer and the dielectric layer, the cutout region includes one or more sidewall diffusion barriers within the cutout region; and a second control gate layer arranged above the first control gate layer and arranged within the cutout region such that the second control gate layer directly contacts the first layer of charge storage material without any intervening layers between the second control gate layer and the first layer of charge storage material.

* * * * *